(12) United States Patent
Rivaud et al.

(10) Patent No.: US 10,247,895 B2
(45) Date of Patent: Apr. 2, 2019

(54) SIDE PLANE

(71) Applicant: Ciena Corporation, Hanover, MD (US)

(72) Inventors: Daniel Rivaud, Ottawa (CA); Kevin Estabrooks, Nepean (CA); Adrianus Van Gaal, Ottawa (CA)

(73) Assignee: Ciena Corporation, Hanover, MD (US)

( * ) Notice: Subject to any disclaimer, the term of this patent is extended or adjusted under 35 U.S.C. 154(b) by 336 days.

(21) Appl. No.: 15/267,393

(22) Filed: Sep. 16, 2016

(65) Prior Publication Data

US 2018/0081137 A1 Mar. 22, 2018

(51) Int. Cl.
*G02B 6/44* (2006.01)
*H05K 7/14* (2006.01)
*H01F 38/14* (2006.01)

(52) U.S. Cl.
CPC .......... *G02B 6/4452* (2013.01); *H05K 7/1492* (2013.01); *H01F 2038/143* (2013.01)

(58) Field of Classification Search
CPC .............. G02B 6/4452; H05K 7/1492; H01F 2038/143
USPC ........................................................ 361/825
See application file for complete search history.

(56) References Cited

U.S. PATENT DOCUMENTS 6,008,547 A * 12/1999 Dobler ................. B60R 16/027
307/10.1

OTHER PUBLICATIONS

"Spring-Loaded Connectors", obtained on Jul. 2016 from www.precidip.com, 12 pages.

* cited by examiner

*Primary Examiner* — Tremesha S Willis
(74) *Attorney, Agent, or Firm* — Clements Bernard Walker PLLC; Christopher L. Bernard; Lawrence A. Baratta, Jr.

(57) ABSTRACT

A system includes a first blade including a first side of the first blade, a second side of the first blade, a front of the first blade, and a back of the first blade. The system further includes a second blade including a first side of the second blade, a second side of the second blade, a front of the second blade, and a back of the second blade. The system further includes a first side plane including a first physical communication channel configured to communicatively connect the first blade to the second blade via the first side of the first blade and the first side of the second blade.

20 Claims, 7 Drawing Sheets

SIDE PLANE

BACKGROUND

Often, the functionality of a computing system is not achieved by a single encapsulated device, but rather through an interconnection of multiple devices. When the devices are collocated in a single room, the devices may be mounted in a rack. In some cases, the rack mounted devices that are co-located may not have a direct communication channel. In other cases, the rack mounted devices may communicate via wires or a backplane that provides communication between devices by being connected to the back of each device. In particular, the wires, backplane, and devices connect via physical sockets and plugs to establish communication. Thus, the individual devices mounted on the rack may plug into the wires or backplane and communicate with each other.

SUMMARY

In general, in one aspect, one or more embodiments relate to a system that includes a first blade including a first side of the first blade, a second side of the first blade, a front of the first blade, and a back of the first blade. The system further includes a second blade including a first side of the second blade, a second side of the second blade, a front of the second blade, and a back of the second blade. The system further includes a first side plane including a first physical communication channel configured to communicatively connect the first blade to the second blade via the first side of the first blade and the first side of the second blade.

In general, in one aspect, one or more embodiments relate to a system that includes a connection structure connecting a first side to a second side, a first blade comprising a third side and a fourth side, a second blade comprising a fifth side and a sixth side, and a first side plane physically coupled to the first side, interposed between the third side and the first side, and interposed between the fifth side and the first side. The first side plane includes a physical communication channel configured to communicatively connect the first blade to the second blade.

In general, in one aspect, one or more embodiments relate to a system. The system includes a frame including a first side of the frame, a second side of the frame, and a connection structure connecting the first side of the frame to the second side of the frame. The frame is configured to mount, in between the first side of the frame and the second side of the frame, a first blade and a second blade. The system further includes a first side plane physically coupled to the first side of the frame, the first side plane including a first physical communication channel configured to communicatively connect the first blade to the second blade.

Other aspects of the invention will be apparent from the following description and the appended claims.

BRIEF DESCRIPTION OF DRAWINGS

FIGS. 1.1, 1.2, 2, 3, and 4 show schematic diagrams in accordance with one or more embodiments of the invention.

FIGS. 5, 6.1, 6.2, 7.1, 7.2, and 7.3 show example communication interfaces that may be used in the side plane in accordance with one or more embodiments of the invention.

DETAILED DESCRIPTION

Specific embodiments of the invention will now be described in detail with reference to the accompanying figures. Like elements in the various figures are denoted by like reference numerals for consistency.

In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

Throughout the application, ordinal numbers (e.g., first, second, third, etc.) may be used as an adjective for an element (i.e., any noun in the application). The use of ordinal numbers is not to imply or create any particular ordering of the elements nor to limit any element to being only a single element unless expressly disclosed, such as by the use of the terms "before", "after", "single", and other such terminology. Rather, the use of ordinal numbers is to distinguish between the elements. By way of an example, a first element is distinct from a second element, and the first element may encompass more than one element and succeed (or precede) the second element in an ordering of elements.

Further, throughout the application, physical relationships between components are described. In such embodiments, one skilled in the art having benefit of this disclosure will appreciate that certain margins of error may exist. Such margins of error are in accordance with manufacturing guidelines and defects. Thus, embodiments are not limited to exact relationship described, but rather include margins of error (e.g., on the order of millimeters or a centimeter, etc.).

In general, embodiments of the invention are directed to a side plane that provides an interconnection between blades in a frame. Rather than being located on the back of the blades and the frame, the side plane is mounted to the side of the frame. In particular, the side plane includes connection sets that may be directly connected to each blade and communication channels that interconnect the connection sets. Thus, through the side plane, the blades in the frame may communicate.

FIGS. 1.1, 1.2, 2, 3, and 4 show schematic diagrams of systems in accordance with one or more embodiments of the invention. In the figures, black solid collinear dots indicate that additional components similar to the components before and after the solid collinear dots may optionally exist. White dots represent a possible fastener to connect the blade to the frame.

Figure 11:
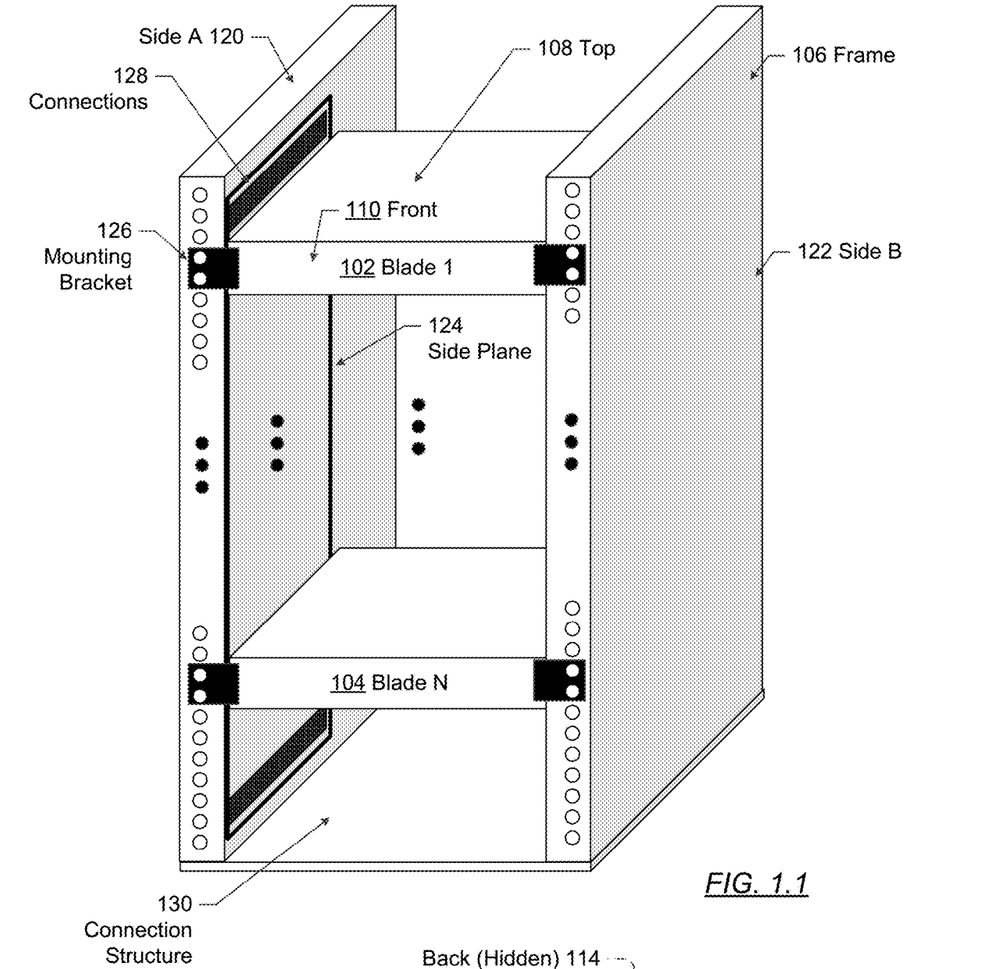

Turning to FIG. 1.1, the system may include one or more blades (e.g., blade 1 (102), blade N (104)), a frame (106), and at least one side plane (124). The blades (e.g., blade 1 (102), blade N (104)) are modular devices that include electrical components and perform a function. In one or more embodiments, each blade may be an individual computing device. The individual computing device may include one or more computer processors, non-persistent storage (e.g., volatile memory, such as random access memory (RAM), cache memory), persistent storage (e.g., a hard disk, an optical drive such as a compact disk (CD) drive or digital versatile disk (DVD) drive, a flash memory, etc.), a communication interface (e.g., Bluetooth interface, infrared interface, network interface, optical interface, etc.), and numerous other elements and functionalities. The computer processor(s) may be an integrated circuit for processing instructions. For example, the computer processor(s) may be one or more cores or micro-cores of a processor. The communication interface may include an integrated circuit for connecting the computing system to a network (not shown) (e.g., a local area network (LAN), a wide area network (WAN) such as the Internet, mobile network, or any other type of network) and/or to another device, such as another blade. The blade may be a stripped-down server computer designed to minimize the use of physical space and energy. For example, the individual computing device may be a server, line card, controller, switch, or another device.

In one or more embodiments, the blades may include multiple individual computing devices inside of the blades. For example, blades may have sub-devices inside the blade.

The blades may be of varying sizes. In other words, the length (e.g., distance from front to back) and/or height (distance from top to bottom) of each blade may be heterogeneous. In other words, the lengths of the blades may vary intentionally. Thus, the variance may be more than a margin of error (e.g., by three or more centimeters). In at least some embodiments, the widths of the blades are the same within a predefined margin of error.

Figure 12:
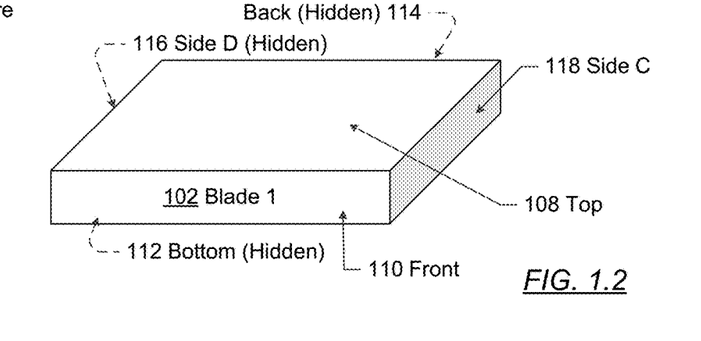

FIG. 1.2 shows a block diagram of blade 1 (102) in FIG. 1.1. For reference purposes, the top (108) and front (110) of the blade 1 (102) is shown in both FIGS. 1.1 and 1.2. In other words, the top (108) and front (110) of the blade 1 blade 1 (102) is the same in both FIGS. 1.1 and 1.2. As shown in FIG. 1.2, blade 1 blade 1 (102) includes a top (108), bottom (112), front (110), sides (e.g., side D (116), side C (118)), and back (114). The top (108) of the blade is the portion of the blade that is above the remainder of the blade when the blade is mounted in the frame. The bottom (112) of the blade is below the remainder of the blade when the blade is mounted in the frame. The front (110) of the blade is a portion of the blade that is visible to a network engineer. In one or more embodiments, the blades slides into the frame such that the front is exposed. The front of the blade may have lights, a screen, and other physical user interface components to present information to a user. The sides (e.g., side D (116), side C (118)) of a blade are configured to be adjacent to the sides of the frame. Further, the sides of the blade connect the front of the blade to the back of the blade, and the bottom of the blade to the top of the blade. Specifically, the blades may slide into the frame along the length of the sides, such that more and more portions of the sides of the frame and blade are adjacent.

Although FIG. 1.2 shows a blade in the shape of a box, a blade may be enclosed or open. By way of an example of enclosed, a blade may be in a pizza box form factor. In other words, a case may surround the blade. By way of an example of an open, the blade may have the components described above, without a top portion of a case, side portions of the case, a bottom portion of the case, or without having any combination thereof. However, even when open, the blade has a top, bottom, front, sides, and back. Further, although FIG. 1.2 shows blade 1 (e.g., blade 1 (102), blade N (104)), the remainder of the blades in the frame has the same components as shown in FIG. 1.2.

Figure 2:
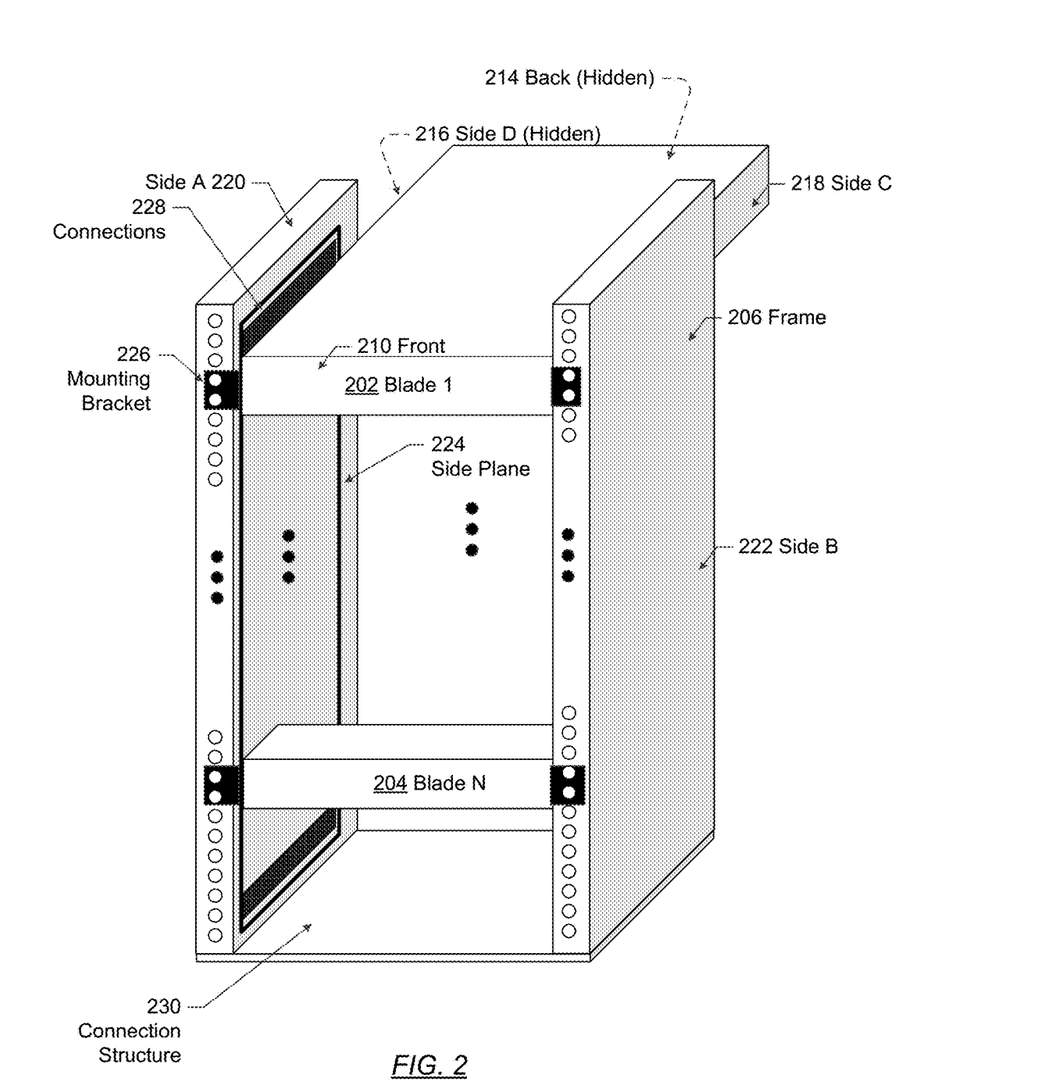

Returning to FIG. 1.1, the frame (106) is a physical structure that is configured to mount the blades. As shown in FIG. 1.1, the frame is configured to mount the blades vertically such that the top of the blade is in the same direction as the top of the frame. For example, the frame may be a server rack, a chassis, or other such physical structure for mounting blades. In some embodiments, the frame is composed, at least partially, of a metal material. Other materials may be used without departing from the scope of the invention. As shown in FIG. 2, the frame may include functionality to mount multiple blades (e.g., blade 1 blade 1 (102), blade N (104), other blades (not shown)) vertically. Although FIG. 1.1, shows the blades as being vertically in the middle of the frame, the blades may span the length of the interior of the frame, may be vertically located at the bottom and/or top portion of the frame, etc.

The frame (106) includes two sides (e.g., side A (120) and side B (122)) and at least one connection structure (130). The connection structure (130) physically connects side A (120) to side B (122). The connection structure (130) may be a base, such as shown in FIG. 1.1, a top (not shown), and/or a mid-support structure that is in between the top of the frame and the bottom of the frame. The connection structure and sides may be formed of the same material, or may be physically attached to each other via fasteners. The frame may further include a front and a back (not shown). For example, the front may be a door or another removable component that allows the blade to be inserted into the frame.

Continuing with FIG. 1.1, one or more mounting brackets (126) may mount the blade to the frame (106). The mounting brackets are shown as solid squares (with white circles) in the front of the blades of FIG. 1.1. As shown in FIG. 1.1, the mounting brackets may be affixed to the front of the blades and the front of the sides of the frames. In one or more embodiments of the invention, the circles in the mounting brackets may be holes for screws or other fasteners to affix the mounting bracket to the side of the frame and the blade. A mounting bracket may be a separate component or a part of the blade or frame. In one or more embodiments of the invention, the mounting bracket maintains the blades in a static position in the frame. FIG. 1.1 show a flush mount version of the frame and blades. In other words, the blades are in a flush mount with the frame, such that the front of the blades are flush with the frame.

As shown in FIG. 1.1, a side plane (124) is interposed between a side of the frame and a side of each blade. The side plane (124) is affixed to the frame, such as through one or more fasteners. For example, the fasteners may be brackets, adhesive, screws, other type of fastener, or any combination thereof. The side plane is physical structure that is configured to communicatively couple blades in the frame. In other words, the side plane (124) includes physical interconnect, that when operating, can transmit a signal between blades in the frame. The physical interconnect operatively connects to the blades via connections (128). The connections may be based on near field communications and/or direct connections. The side plane (124) may be completely interposed between the blades and the frame or only partially interposed between the blades and the frame. For example, the side plane may be smaller than the sides of the blades and/or the frame. The side plane may be made using printed circuit boards, cable, or another material.

In addition to a physical interconnect, the side plane (124) may include one or more active components. An active component is a component that uses power to provide a function. In other words, an active component is an electronic device that is operable to performed a function. Examples of active components that may be located on the side plane include computer processors, non-persistent storage, persistent storage, digital logic unit, field programmable gate array, or another a device that uses power. The side plane is described in further detail with reference to FIG. 4.

Although FIG. 1.1 shows a single side plane, at least two side planes may exist, whereby the two side planes are located on each side of the blade. In other words, a side plane (124) may be interposed between the side of the blade and the side of the frame, and another side plane may be interposed between the other side of the blade and the other side of the frame. The side planes may be redundant of each other and/or provide different functionality than each other. For example, when redundant, if one of the side planes is inoperable (e.g., disabled, defective, or have another condition preventing communication), the other side plane may perform the functionality of the interconnect. Thus, the redundancy allows for a side plane to be replaced without interrupting operations of the blades. Furthermore, with redundant functionality, additional signally bandwidth may be achieved between blades of the frames through the physical communication channels of both blades. With different functionality, the multiple side planes provide for a greater number of connections than a single side plane. Thus, having two possible side planes allows for upgrading the side without disabling the system. Additionally, a larger plane may be added to a side to provide more connections.

Further, although not shown in FIG. 1.1, the system may include a backplane. In other words, the existence of a side plane and a backplane are not mutually exclusive. Thus, side planes (124) may exist on the sides of the device and a backplane may exist on the back of the device.

FIG. 2 shows another configuration of a system in accordance with one or more embodiments of the invention. As shown in FIG. 2, the system includes a frame (206) having sides (e.g., side A (220), side B (222)) and a connection structure (230). The frame (206) is configured to mount blades (e.g., blade 1 (202), blade N (204)). The blades (e.g., blade 1 (202), blade N (204)) may include a front (210), back (214), side C (218), and side D (216). The blades may be affixed to the frame via mounting brackets (226). Interposed between the blades and at least on side of the frame is side plane (224) having connections (228). The frame (206), sides (e.g., side A (220), side B (222)) of the frame, connection structure (230), blades (e.g., blade 1 (202), blade N (204)), front (210), back (214), side C (218), side D (216), mounting brackets (226), side plane (224), and connections (228) is the same or similar to frame (106), sides (e.g., side A (120), side B (122)) of the frame, connection structure (130), blades (e.g., blade 1 (102), blade N (104)), front (110), back (114), side C (118), side D (116), mounting brackets (126), side plane (124), and connections (128).

In the embodiment shown in FIG. 2, the blades are flush mounted to the frame and are of varying sizes. At least some of the blades (e.g., blade 1 (202)) may extend beyond the back of the frame (206) while other blades (e.g., blade N (204)) may have a length less than the length of the frame. By using a side plane, the blades do not need to extend to the back of the frame. Thus, the blades may be of varying lengths and still connect with each other.

Figure 3:
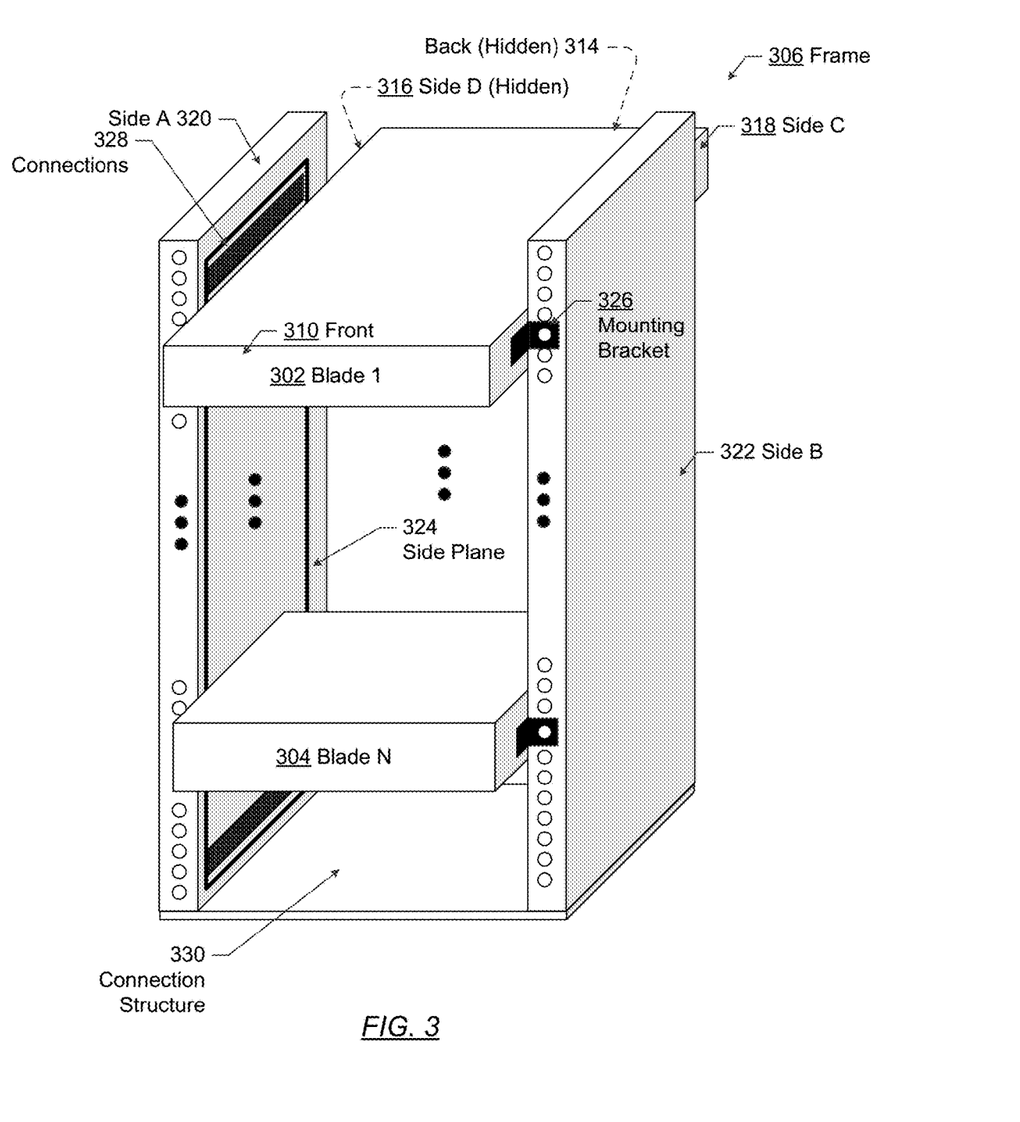

FIG. 3 shows another configuration of a system in accordance with one or more embodiments of the invention. As shown in FIG. 3, the system includes a frame (306) having sides (e.g., side A (320), side B (322)) and a connection structure (330). The frame (306) is configured to mount blades (e.g., blade 1 (302), blade N (304)). The blades (e.g., blade 1 (302), blade N (304)) may include a front (310), back (314), side C (318), and side D (316). The blades may be affixed to the frame via mounting brackets (326). Interposed between the blades and at least on side of the frame is side plane (324) having connections (328). The frame (306), sides (e.g., side A (320), side B (322)) of the frame, connection structure (330), blades (e.g., blade 1 (302), blade N (304)), front (310), back (314), side C (318), side D (316), mounting brackets (326), side plane (324), and connections (328) is the same or similar to frame (106), sides (e.g., side A (120), side B (122)) of the frame, connection structure (130), blades (e.g., blade 1 (102), blade N (104)), front (110), back (114), side C (118), side D (116), mounting brackets (126), side plane (124), and connections (128).

In the embodiment shown in FIG. 3, the blades are side mounted to the frame and are of varying sizes. For example, the mounting bracket (326) connects to the side (e.g., side C (318)) of the blades and the front of the frame. Thus, the blade is not flush to the frame. The blades may be of varying sizes and may or may not extent to or past the back of the frame. By using a side plane, the blades may be in various configurations with respect to the frame.

All combinations of the various embodiments shown in FIGS. 1.1, 1.2, 3, and 4 are contemplated herein. In other words, one or more embodiments are not limited to the individual configurations shown in FIGS. 1.1, 1.2, 3, and 4.

Figure 4:
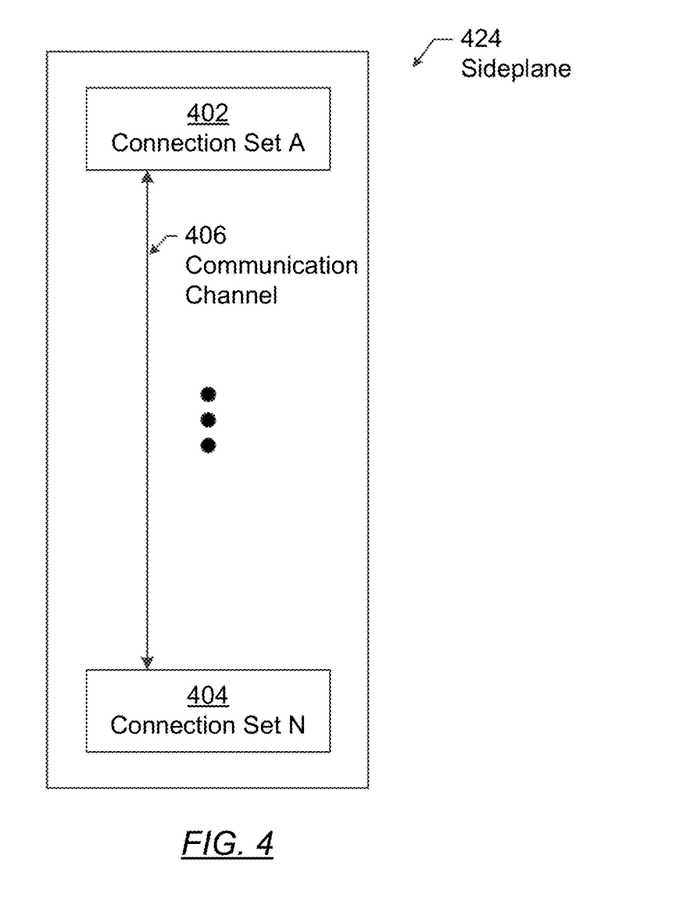

FIG. 4 shows an example of a side plane (424) in accordance with one or more embodiments of the invention. As shown in the example in FIG. 4, the side plane (424) includes vertically stacked connection sets (e.g., connection set A (402), connection set N (404)) and one or more communication channels between the stacked connection sets. Each connection set is a set of one or more connections (e.g., physical interfaces) to connect to an individual blade. The communication channel is a physical communication channel that provides a path for signals to travel between connections that are connected to different blades. For example, the physical communication paths may be optical paths defined by wave guides, conductive traces on a printed circuit board, fiber, or another physical path type.

Figure 5:
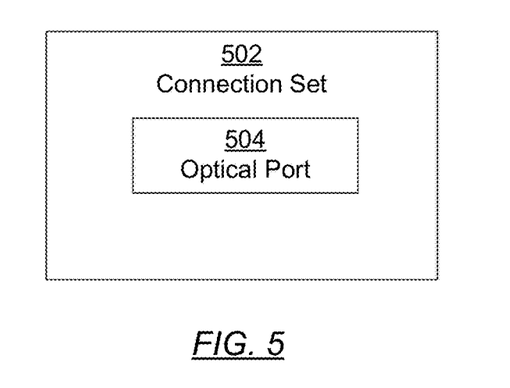

In one or more embodiments of the invention, the connections of the side plane are flush with the side plane and blade or configured to be movable to allow the blades to slide into position. FIGS. 5, 6.1, 6.2, 7.1, 7.2, and 7.3 show example connections that may be used in the side plane in accordance with one or more embodiments of the invention. Different types of connections may exist. For example, the connections may implement inductive coupling, conductive material brush contacts, spring loaded pins, optical connections, and a ball and clamping mechanism.

Turning to FIG. 5, FIG. 5 shows an example of a connection set (502) having an optical port (504) to implement an optical connection. For example, a laser on the blade may shine light to the optical port, which connects to a channel. The channel may guide the light to another port to another blade. As another example, the side plane may include an optical-electrical interconnect. Thus, the optical may be a free space optical or implemented through waveguides.

Figure 61:
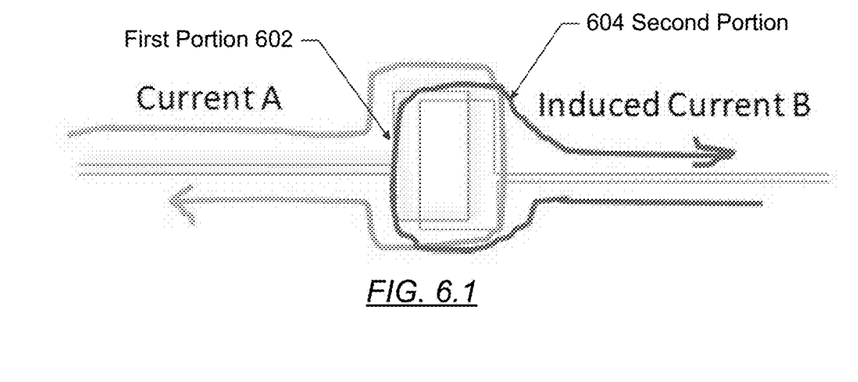
Figure 62:
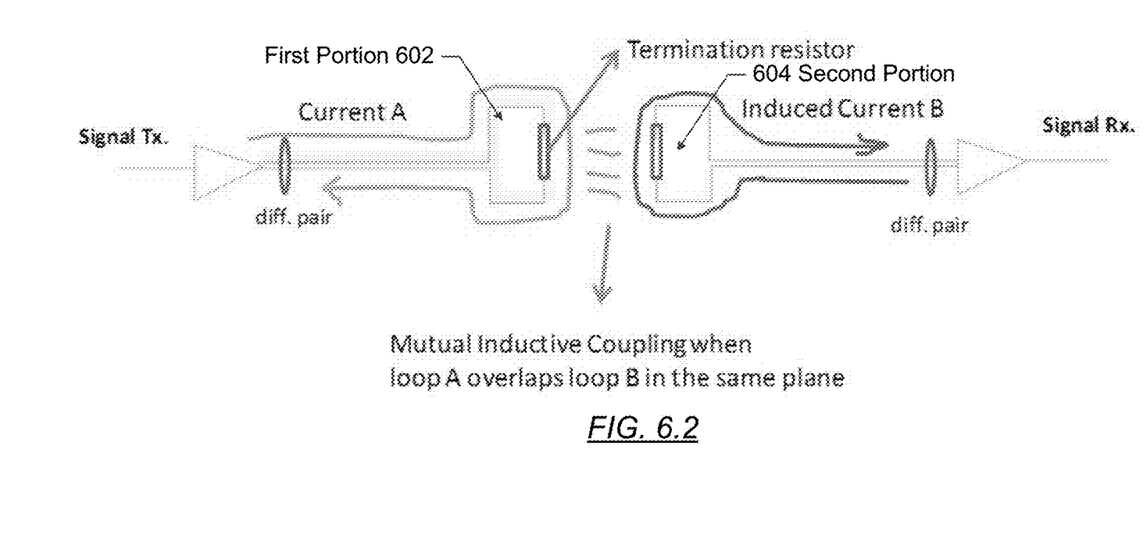

FIGS. 6.1 and 6.2 show examples of connections formed by portions of inductive coupling. Turning to FIG. 6.2, a current flows (e.g., current A) through a first portion (602) of the inductive coupler. The first portion (602) of the inductive coupler may be on the side plane. The current induces a current (e.g., induced current B) on a second portion (604) of the inductive coupler, whereby the second portion (604) may be located on the blade. A similar mechanism may be used to transmit a signal from the blade to the side plane. For example, a current on the blade may induce a current on the side plane. Variations in the current may correspond to a signal that is interpreted by the blade. In FIG. 6.1, the first portion (602) and the second portion (604) are shown as overlaid. A gap, such as by applying a non-conductive conformal coating on each portion, may exist to prevent current to flow between the loops. Thus, a small electromagnetic field may be induced to create the signal.

Figure 71:
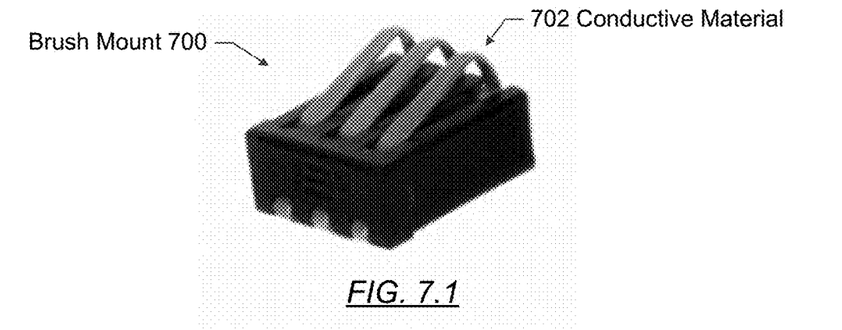
Figure 72:
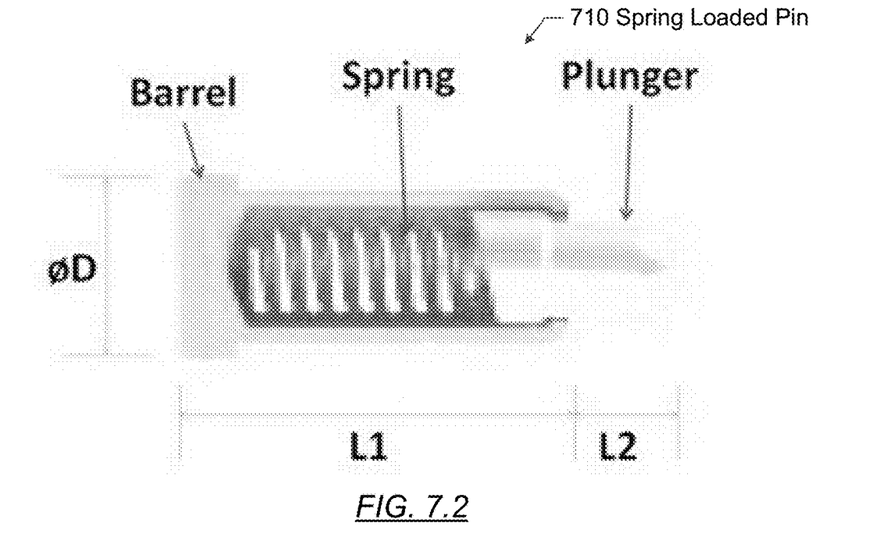
Figure 73:
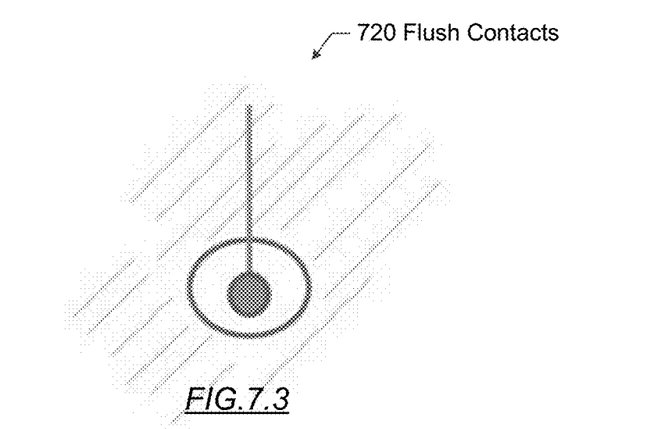

FIGS. 7.1, 7.2, and 7.3 show electrical connections that may be connected to or part of the side plane. In particular, FIG. 7.1 shows a brush mount (700). The brush mount (700) includes a conductive material that bends and connects to electrical components. The brush mount (700) may be mounted on the blade. In such a scenario, the brush mount may be connected to an electrical connection on the blade. When the blade slides into position on the side plane, the brush mount may be connected to a conductive pad on the side plane. By way of another example, the brush mount may be mounted on the side plane and connected to electrical components on the side plane. When the blade slides into position, the brush mount on the side plane connects to conductive pads on the blade.

FIG. 7.2 shows an example of a spring loaded pin (710) in accordance with one or more embodiments of the invention. The spring loaded pin (710) includes a barrel, spring, and plunger. The barrel holds the plunger, and the spring applies a force to push the plunger into place. Similar to FIG. 7.1, when the blade is in place, the spring pushes the plunger against a conductive pad. The spring loaded pin (710) may be located on the blade or the side plane.

FIG. 7.3 shows another example of an electrical connection that may be used in accordance with one or more embodiments of the invention. The electrical connection may be achieved through flush contacts (720) on the blade and the side plane.

Figure 8:
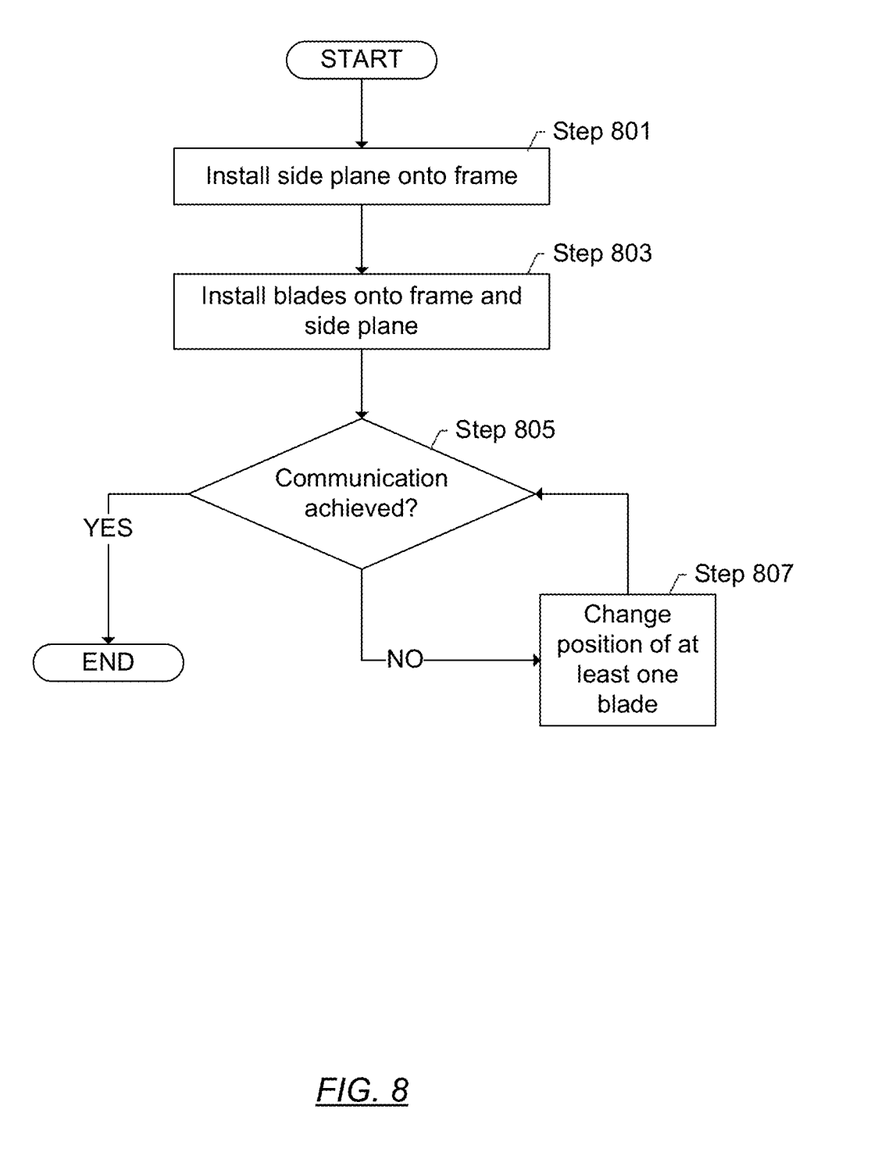
FIG. 8 shows a flowchart in accordance with one or more embodiments of the invention.

FIG. 8 shows a flowchart in accordance with one or more embodiments of the invention. In Step 801, a side plane is installed onto the frame in accordance with one or more embodiments of the invention. For example, the side plane may be affixed to the frame using one or more fasteners.

In Step 803, blades are installed onto the frame and the side plane in accordance with one or more embodiments of the invention. The blades may be slid into the frame from the front of the frame to the back of the frame. Because of the mechanism or mechanisms for connections, the blades are capable of being slid into place while still allowing for the blades to communicatively connect to the side plane.

In Step 805, a determination is made whether communication is achieved.

In particular, because one or more embodiments may rely on an alignment of connections on the blade and the side plane, communication may be suboptimal or not achieved when a misalignment occurs. The system may be configured to test for misalignment by checking signal strength and/or a checksum transmitted between the blade and the side plane. If the signal strength is below a threshold or the checksum is incorrect, the determination may be made that the blade and side plane are misaligned. A user may be informed of the misalignment via a user interface component on the blade, frame, side plane, etc. If a determination is made that communication is not achieved, the flow may proceed to Step 807. In Step 807, the position of at least one blade is changed. In other words, the blade may be move with respect to the side plane. The flow may return to Step 805 to check for realignment.

If communication is achieved, the flow may proceed to end and the blades may be used. In other words, power may be provided to the side plane(s) and the blades through the side plane. The blades may communicate with each other through the side plane. Although not discussed above, the side plane may include additional communication channels to connect the blades to external communication devices via external communication links (e.g., not within the frame).

As shown, the side plane does not restrict the blades to a particular depth, such as when designing a new blade. Further, by having multiple side planes, a side plane may be upgraded without affecting an operation of the system. Moreover, with the connections on the side, the side plane may reduce insertion force and eliminate bent pins.

While the above FIGs shows a configuration of components, other configurations may be used without departing from the scope of the invention. For example, various components may be combined to create a single component. As another example, the functionality performed by a single component may be performed by two or more components.

Embodiments of the invention may be implemented on a computing system. The computing system may also include one or more input device(s), such as a touchscreen, keyboard, mouse, microphone, touchpad, electronic pen, or any other type of input device. Further, the computing system may include one or more output device(s), such as a screen (e.g., a liquid crystal display (LCD), a plasma display, touchscreen, cathode ray tube (CRT) monitor, projector, or other display device), a printer, external storage, or any other output device. One or more of the output device(s) may be the same or different from the input device(s). The computing system may be connected to a network (e.g., a local area network (LAN), a wide area network (WAN) such as the Internet, mobile network, or any other type of network) via a network interface connection (not shown). The input and output device(s) may be locally or remotely (e.g., via the network) connected to the computer processor(s), memory, and storage device(s). Many different types of computing systems exist, and the aforementioned input and output device(s) may take other forms.

Software instructions in the form of computer readable program code to enable embodiments of the invention may be stored, in whole or in part, temporarily or permanently, on a non-transitory computer readable medium such as a CD, DVD, storage device, a diskette, a tape, flash memory, physical memory, or any other computer readable storage medium. For example, the software instructions may correspond to computer readable program code that when executed by a processor(s), is configured to design a system as described herein, design a side plane, send alerts of operable connections, and design the side plane.

Further, one or more elements of the aforementioned computing system may be located at a remote location and connected to the other elements over a network. Further, embodiments of the invention may be implemented on a distributed system having a plurality of nodes, where each portion of the invention may be located on a different node within the distributed system. In one embodiment of the invention, the node corresponds to a distinct computing device. Alternatively, the node may correspond to a computer processor with associated physical memory. The node may alternatively correspond to a computer processor or micro-core of a computer processor with shared memory and/or resources.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A system comprising:
    a first blade comprising a first side of the first blade, a second side of the first blade, a front of the first blade, and a back of the first blade;
    a second blade comprising a first side of the second blade, a second side of the second blade, a front of the second blade, and a back of the second blade; and a first side plane on a first side of the system, the first side plane comprising a first physical communication channel configured to communicatively connect the first blade to the second blade via the first side of the first blade and the first side of the second blade;

wherein each of the first blade and the second blade is a modular device that includes electrical components to perform a function in a network, and wherein each of the first blade and the second blade is configured to slide into position between the first side of the system and an opposing second side of the system to connect to the first physical communication channel on the first side plane.

2. The system of claim 1, further comprising, on the second side of the system, a second side plane comprising a second physical communication channel configured to communicatively connect the first blade to the second blade via the second side of the first blade and the second side of the second blade.

3. The system of claim 2, wherein the second physical communication channel is redundant of the first physical communication channel.

4. The system of claim 2, wherein the second physical communication channel performs a different function than the first physical communication channel.

5. The system of claim 1, wherein the first side plane comprises a first portion of an inductive coupler, wherein a second portion of the inductive coupler is located on the first blade, and wherein the first portion of the inductive coupler and the second portion of the inductive coupler are configured to communicate via inductive coupling.

6. The system of claim 1, wherein the first side plane comprises an exposed electrical contact configured to communicatively connect the first blade to the first physical communication channel.

7. The system of claim 1, wherein the first side plane comprises an optical port that is configured to communicatively connect the first blade to the first physical communication channel.

8. A system comprising:
a connection structure connecting a first side to a second side;
a first blade comprising a third side and a fourth side;
a second blade comprising a fifth side and a sixth side; and
a first side plane physically coupled to the first side, interposed between the third side and the first side, and interposed between the fifth side and the first side, the first side plane comprising a physical communication channel configured to communicatively connect the first blade to the second blade;

wherein each of the first blade and the second blade is a modular device that includes electrical components to perform a function in a network, and wherein each of the first blade and the second blade is configured to slide into position between the first side and the second side to connect to the physical communication channel.

9. The system of claim 8, wherein the first side plane comprises a first portion of an inductive coupler, wherein a second portion of the inductive coupler is located on the first blade, and wherein the first portion of the inductive coupler and the second portion of the inductive coupler are configured to communicate via inductive coupling.

10. The system of claim 8, wherein the first side plane comprises an exposed electrical contact configured to communicatively connect the first blade to the physical communication channel.

11. The system of claim 8, wherein the first side plane comprises an optical port that is configured to communicatively connect the first blade to the physical communication channel.

12. The system of claim 8, further comprising:
a mounting bracket configured to affix the first blade in a static position to the first side, wherein the mounting bracket is attached to at least one of the third side and a front of the first blade.

13. The system of claim 8, wherein the first blade has a different length than the second blade.

14. A system comprising:
a frame comprising a first side of the frame, a second side of the frame, and a connection structure connecting the first side of the frame to the second side of the frame, wherein the frame is configured to mount, in between the first side of the frame and the second side of the frame, a first blade and a second blade; and
a first side plane physically coupled to the first side of the frame, the first side plane comprising a first physical communication channel configured to communicatively connect the first blade to the second blade, wherein each of the first blade and the second blade is a modular device that includes electrical components to perform a function in a network, and wherein each of the first blade and the second blade is configured to slide into position between the first side of the frame and the second side of the frame to connect to the first physical communication channel.

15. The system of claim 14, further comprising:
a second side plane physically coupled to the second side of the frame, the second side plane comprising a second physical communication channel configured to communicatively connect the first blade to the second blade.

16. The system of claim 15, wherein the second physical communication channel is redundant of the first physical communication channel.

17. The system of claim 15, wherein the second physical communication channel performs a different function than the first physical communication channel.

18. The system of claim 14, wherein the first side plane comprises a first portion of an inductive coupler, wherein a second portion of the inductive coupler is located on the first blade, and wherein the first portion of the inductive coupler and the second portion of the inductive coupler are configured to communicate via inductive coupling.

19. The system of claim 14, wherein the first side plane comprises an exposed electrical contact configured to communicatively connect the first blade to the first physical communication channel.

20. The system of claim 14, wherein the first side plane comprises an optical port that is configured to communicatively connect the first blade to the first physical communication channel.

* * * * *